United States Patent
Choi et al.

[11] Patent Number: 6,146,943
[45] Date of Patent: Nov. 14, 2000

[54] METHOD FOR FABRICATING NONVOLATILE MEMORY DEVICE

[75] Inventors: Woong-Lim Choi; Kyeong-Man Ra, both of Chungcheongbuk-do, Rep. of Korea

[73] Assignee: Hyundai Electronics Industries Co., Ltd., Ichon-shi, Rep. of Korea

[21] Appl. No.: 09/033,670

[22] Filed: Mar. 3, 1998

Related U.S. Application Data

[63] Continuation-in-part of application No. 08/890,564, Jul. 9, 1997, Pat. No. 5,892,714.

[30] Foreign Application Priority Data

Jul. 9, 1997 [KR] Rep. of Korea ....................... 97 31838

[51] Int. Cl.[7] .................................................. H01L 21/336
[52] U.S. Cl. ........................... 438/257; 438/262; 438/263; 438/264; 438/622
[58] Field of Search ................................... 438/622, 257, 438/262, 263, 264; 365/185.22; 257/211

[56] References Cited

U.S. PATENT DOCUMENTS

| | | | |
|---|---|---|---|
| 4,267,632 | 5/1981 | Shappir | 29/571 |
| 5,043,940 | 8/1991 | Eliyahou | 365/185.3 |
| 5,355,332 | 10/1994 | Endoh et al. | 365/182 |
| 5,386,132 | 1/1995 | Wong | 257/316 |
| 5,386,388 | 1/1995 | Atwood et al. | 365/185.22 |
| 5,422,842 | 6/1995 | Cernea et al. | 365/185.26 |
| 5,426,611 | 6/1995 | Maruyama | 365/185.22 |
| 5,452,249 | 9/1995 | Miyamoto et al. | 365/185.24 |
| 5,471,422 | 11/1995 | Chang et al. | 365/185.26 |
| 5,513,193 | 4/1996 | Hashimoto | 365/185.22 |
| 5,568,426 | 10/1996 | Roohparvar et al. | 365/185.22 |
| 5,656,840 | 8/1997 | Yang | 257/316 |
| 5,781,476 | 7/1998 | Seki et al. | 365/185.22 |
| 5,892,714 | 4/1999 | Choi | 365/185.22 |
| 5,936,889 | 8/1999 | Choi | 365/185.22 |

OTHER PUBLICATIONS

Silicon Processing, S. Wolf and R.N. Tauber, 1986, vol. 1, p. 161.

Kume, Hitoshi, et al., "A 1.28$\mu m^2$ Contactless Memory Cell Technology for a 3V–Only 64Mbit EEPROM", International Electron Devices Meeting, Dec. 1992, pp. 991–993.

*Primary Examiner*—Mary Wilczewski
*Assistant Examiner*—James Park
*Attorney, Agent, or Firm*—Fleshner & Kim, LLP

[57] ABSTRACT

A method is provided for fabricating a nonvolatile memory device having a simple stacked stricture with program gates. The method includes forming bitlines of second conductivity type along a first direction separated by a first prescribed distance in a substrate of a first conductivity type and forming first lines on the substrate along a second direction separated from one another by a second prescribed distance. The second direction is substantially perpendicular to the first direction, and the first lines include a first conductive layer on an isolating layer. A gate insulating layer is formed on the substrate and a tunneling insulating layer on the first conductive lines and a second conductive layer is formed on the entire surface. The second conductive layer, the tunneling insulating layer, and the first conductive lines are selectively removed to form second conductive lines along the first direction and program gates. A dielectric film is formed on the second conductive lines and a third conductive layer and an insulating layer are formed on the entire surface. The insulating layer, the third conductive layer, the dielectric film, and the second conductive lines are selectively removed to form word lines in the second direction and floating gates between the first conductive lines. Insulating sidewall spacers are formed on both sides of the patterned insulating layer, the word lines, the dielectric film, and the floating gates and contact holes are formed in the tunneling insulating layer. Then, program lines are formed coupled to the program gates through the contact holes.

24 Claims, 10 Drawing Sheets

F I G. 7
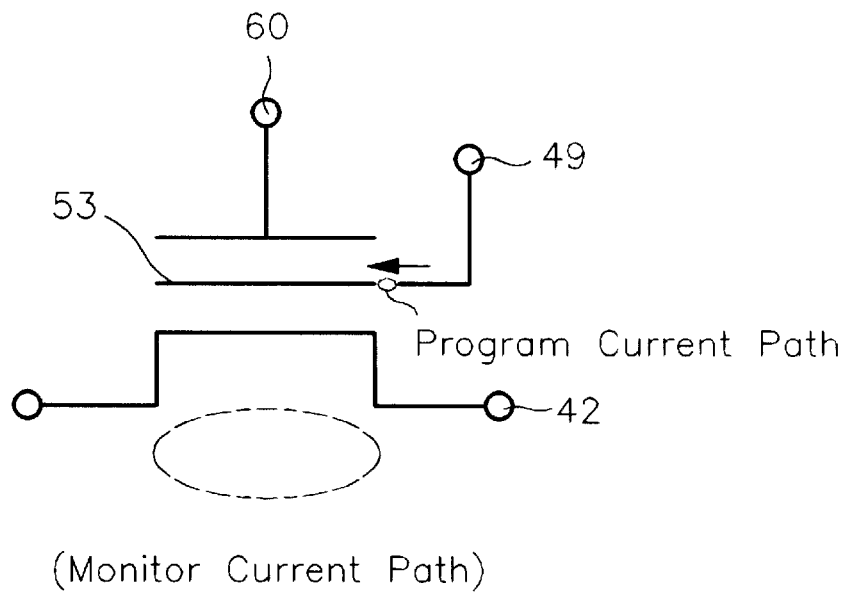
F I G. 8
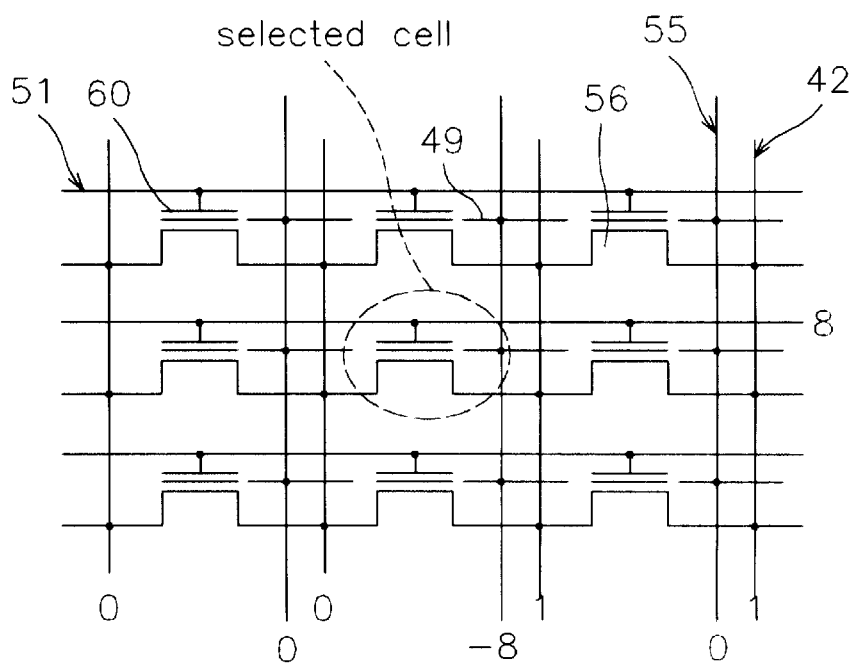

F I G.9
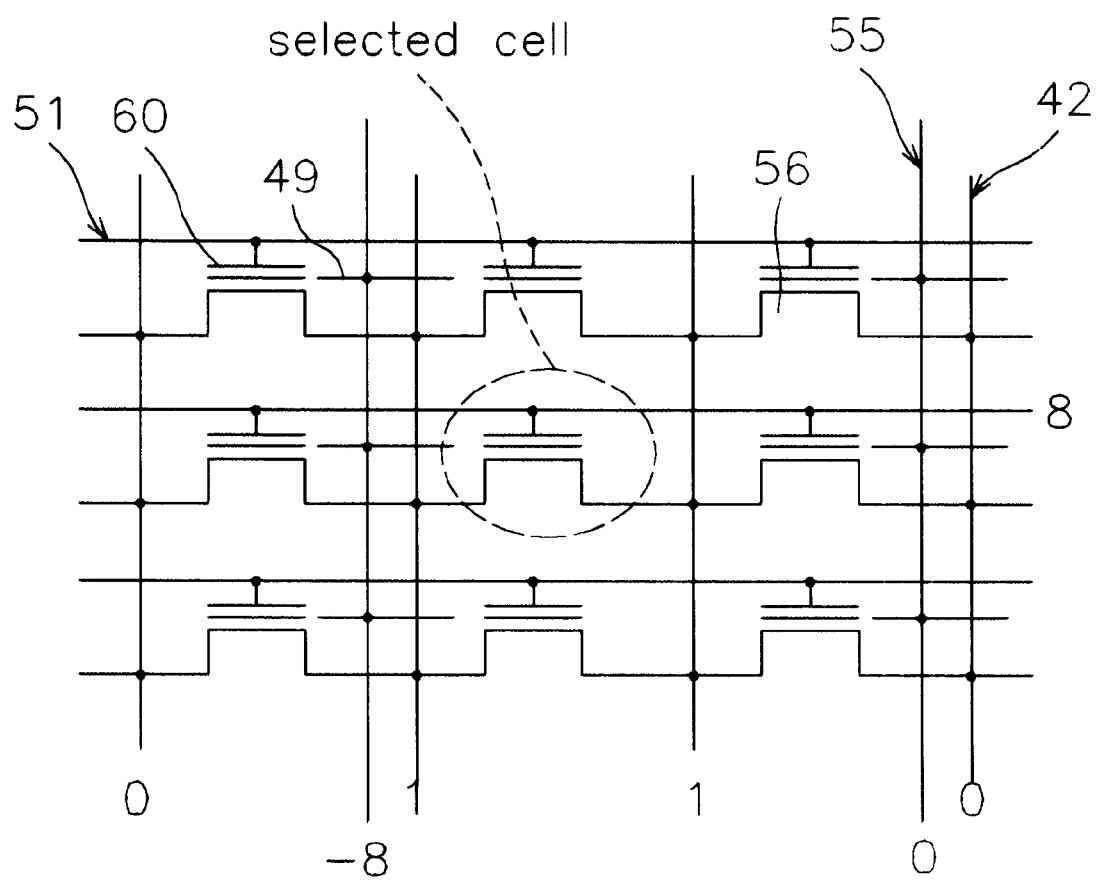

F I G. 12
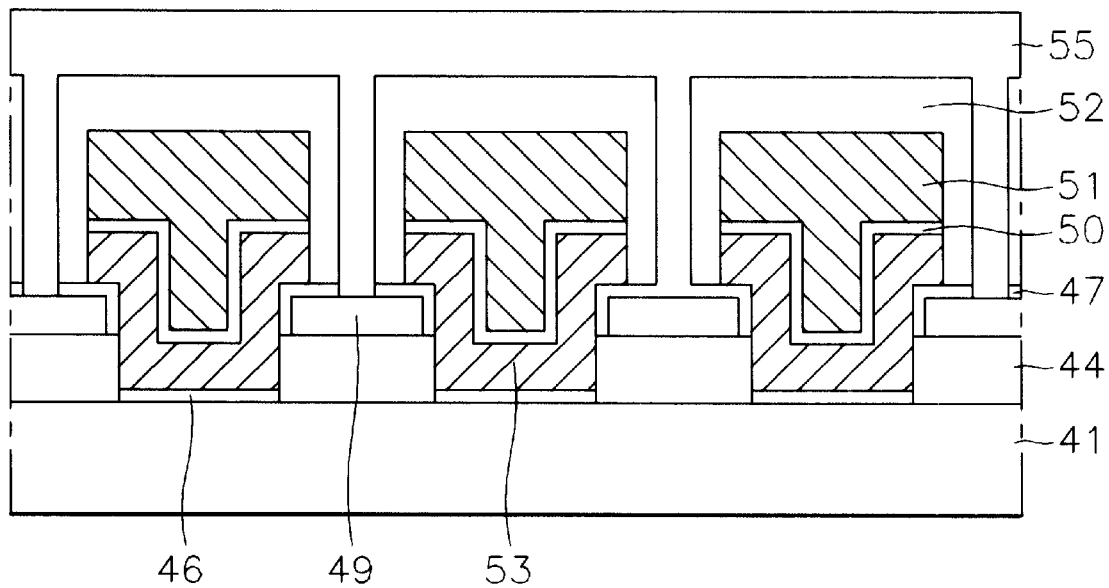
F I G. 13
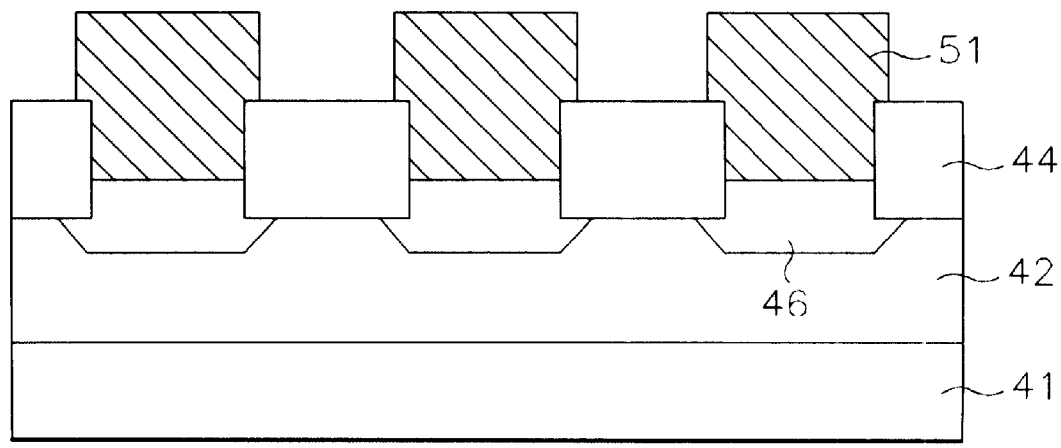

METHOD FOR FABRICATING NONVOLATILE MEMORY DEVICE

This is a continuation-in-part application of U.S. Ser. No. 08/890,564 filed Jul. 9, 1997 U.S. Pat. No. 5,892,714.

BACKGROUND OF THE INVENTION

1. Field of the Invention

The present invention relates to a semiconductor device, and more particularly, to a method for fabricating a nonvolatile memory device.

2. Background of the Related Art

Effective sizes of memories, which determine packing densities of nonvolatile memory devices such as flash electrically erasable programmable read only memories (flash EEPROMs) and EEPROMs, depend on sizes of cells and array structure of cells. In an aspect of memory cells, a smaller or minimum cell structure is a simple stacked structure.

A conventional nonvolatile memory device having a simple stacked structure is shown in FIG. 1. A floating gate 13 is formed on a tunneling oxide layer 12 formed on a p-type semiconductor substrate 11. Over the floating gate 13, there is formed a control gate 15. A dielectric layer 14 is formed between the control gate 15 and the floating gate 13. N-type impurity regions 16 are formed beneath the surface of the semiconductor substrate 11 at both sides of the floating gate 13.

As shown in FIG. 2, in an array of memory cells having a simple stacked nonvolatile memory device, word lines 17 are formed on a semiconductor substrate (not shown) in a first direction spaced apart from one another by a predetermined distance. Metal bitlines 18 are formed in a direction at right angles to the word lines 17 and spaced apart from one another by a predetermined distance. One common drain line 20 per two word lines 17 is formed in the same direction as the word lines 17. However, since one metal contact hole 19 is needed per two cells, an effective size of a memory cell becomes large.

To solve such a problem, FIG. 3 illustrates an array circuit diagram showing a nonvolatile memory device, and FIG. 4 is a cross-sectional view showing a structure of the nonvolatile memory device taken along line IV—IV of FIG. 3.

In the nonvolatile memory device of FIG. 3, source and drain impurity regions 29 are used as bitlines. That is to say, a plurality of pairs of n-type heavily doped impurity regions are formed in a direction spaced apart from one another by a predetermined distance. Word lines 23 are formed at right angles to the source and drain impurity regions 29 spaced apart from one another by a predetermined distance. At this time, the pairs of the impurity regions are isolated by isolating layers 28. A pair of impurity regions are used as a source and a drain as well as $n^+$ bitlines 29.

Floating gates 24 are formed between the word lines 23 and pairs of impurity regions. At this time, the word line 23 over the floating gates 24 becomes a control gate. A dielectric layer 26 is formed between the control gate and the floating gate 24, and a gate code oxide layer 27 is formed between the floating gate 24 and the semiconductor substrate 21.

At the ends of the $n^+$ bitlines 29 (i.e., source and drain impurity regions) there are placed a plurality of selection transistors 30 for selecting the $n^+$ bitlines 29. Metal contact holes 31 are connected to a plurality of selection transistors 30. The metal contact holes 31 connect the selection transistors 30 with metal data lines (not shown).

As described above, in the conventional nonvolatile memory device of FIG. 3, one metal contact hole per 32 cells or more than 32 cells is needed because of smaller resistances of impurity regions even though a bitline per a cell is not formed. Thus, smaller effective cell sizes are required.

However, in the conventional nonvolatile memory devices of FIGS. 3–4, two adjacent cells along the direction of word lines are under the same bias condition. Thus, program disturb can be generated so that a non-selected cell is programmed or erased. To solve such program disturb problems, bitlines are separated from one another to separate sources and drains between adjacent cells or asymmetric channel-dividing cells having selection gates are used as memory cells.

FIG. 5 is a circuit diagram of an array of a conventional nonvolatile memory device in which sources are separated from drains. As shown in FIG. 5, since a source and a drain of each cell are separated, pairs of source lines and drain lines 32 and 33 are formed in a direction to be spaced apart from one another by a predetermined distance. The source lines 32 are connected to n-type heavily doped source impurity regions (not shown) and the drain lines 33 are connected to the n-type heavily doped drain impurity regions (not shown). Word lines 23 are formed at right angles to the source and drain lines 32 and 33.

Each of metal data lines 34 is formed at one end of the drain lines 33 and in the same direction as the drain lines 33. A plurality of selection transistors 30 are formed at ends of the source and drain lines 32 and 33. Metal contact holes 31 are connected to the selection transistors 30. The metal contact holes 31 connect the selection transistors 30 and the metal data lines 34. However, the conventional nonvolatile memory device having the source and drain of each cell separated disadvantageously increases a size of the unit cell because of the division of bitlines.

In a related art nonvolatile memory device as shown in FIG. 6, a floating gate 24 is formed on a gate oxide layer 27 formed on a p-type semiconductor substrate 21. A control gate 25 is formed over the floating gate 24. A selection gate 35 is formed on the gate oxide layer 27 and over the control gate 25. A dielectric layer 26 is formed between the selection gate 35 and the control gate 25 and the floating gate 24. The dielectric layer 26 is also formed between the control gate 25 and the floating gate 24. A pair of n-type source and drain regions 22 are formed beneath the surface of the semiconductor substrate 21. At this time, one of the source and drain regions 22 is formed to be aligned with one side of the floating gate 24 and the other of the source and drain regions 22 is formed to be spaced apart from the other side of the floating gate 24. However, the related art nonvolatile memory device in which channel-dividing cells have an asymmetrical structure disadvantageously increases a size of a unit cell because of the selection gates.

SUMMARY OF THE INVENTION

An object of the present invention is to provide a method for fabricating a nonvolatile memory device that substantially obviates one or more of problems caused by limitations and disadvantages of the related art.

Another object of the present invention is to provide a method for fabricating a nonvolatile memory device that reduces program disturb.

Another object of the present invention is to provide a method for fabricating a nonvolatile memory device that has a smaller effective cell size.

To achieve at least these and other advantages in a whole or in part and in accordance with the purpose of the present invention, as embodied and broadly described, a method for fabricating a nonvolatile memory device according to the present invention includes forming bitlines of a second conductivity type in a first direction being spaced apart from one another by a first predetermined distance in a substrate of a first conductivity type; successively forming an isolating layer and a first conductive layer and then selectively removing the isolating layer and the first conductive layer to be spaced apart from one another at substantially right angles to the bitlines to form first conductive lines; forming a gate insulating layer on the substrate and simultaneously forming a tunneling insulating layer on surfaces of the first conductive lines on the isolating layer; forming a second conductive layer on the entire surface, and selectively removing the second conductive layer, the tunneling insulating layer, and the first conductive lines to form second conductive lines for floating and program gates between the bitlines; forming a dielectric film on the second conductive lines; successively forming a third conductive layer and an insulating layer on the entire surface including the dielectric layer, selectively removing the insulating layer, the third conductive layer, the dielectric layer, and the second conductive lines to form word lines and floating gates between the first conductive lines and at substantially right angles to the bitlines; forming insulating sidewall spacers on both sides of the patterned insulating layer, the word line, the dielectric layer, and the floating gate; selectively patterning the program tunneling insulating layer by using the insulating sidewall spacers as a mask to form contact holes; and forming program lines electrically coupled to the program gates through the contact holes on the insulating layer between the bitlines.

To further achieve these and other advantages in a whole or in part and in accordance with the purpose of the present invention, as embodied and broadly described, a method for fabricating a nonvolatile memory device according to the present invention includes forming first signal lines of second conductivity type along a first direction separated by a first prescribed distance in a substrate of a first conductivity type, forming second signal lines on the substrate along a second direction separated from one another by a second prescribed distance, wherein the second direction is substantially perpendicular to the first direction, and wherein the second signal lines include first conductive lines on an isolating layer, forming a first insulating layer on the substrate and a second insulating layer on the second signal lines, forming a second conductive layer on the entire surface, and selectively removing the second conductive layer, the second insulating layer, and thirst conductive lines to form third signal lines along the first direction and first gates, forming a dielectric film on the third signal lines, forming a third conductive layer and a third insulating layer on the entire surface, and selectively removing the third insulating layer, the third conductive layer, the dielectric film, and the third signal lines to form fourth signal lines and second gates between the first conductive lines, wherein the fourth signal lines extend along the second direction, forming insulating sidewall spacers on both sides of the patterned third insulating layer, the fourth signal lines, the dielectric film, and the second gates, forming contact holes in the second insulating layer, and forming fifth signal lines coupled to the first gates through the contact holes.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 7 shows an exemplary symbol of a nonvolatile memory cell according to a preferred embodiment;

FIG. 8 is a circuit diagram showing an exemplary first array that nonvolatile memory cells constitute according to the present invention;

FIG. 9 is a circuit diagram showing an exemplary second array that nonvolatile memory cells constitute according to the present invention;

FIG. 12 is a diagram showing a cross-sectional view of the nonvolatile memory device, taken along line XII—XII of FIG. 10;

FIG. 13 is a diagram-showing a cross-sectional view of the nonvolatile memory device, taken along line XIII—XIII of FIG. 10;

DETAILED DESCRIPTION OF PREFERRED EMBODIMENTS

Figure 1:
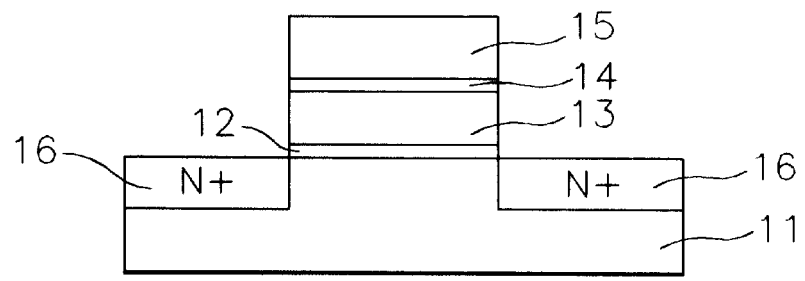
FIG. 1 is a cross-sectional view showing a conventional nonvolatile memory cell having a simple stacked structure.
Figure 2:
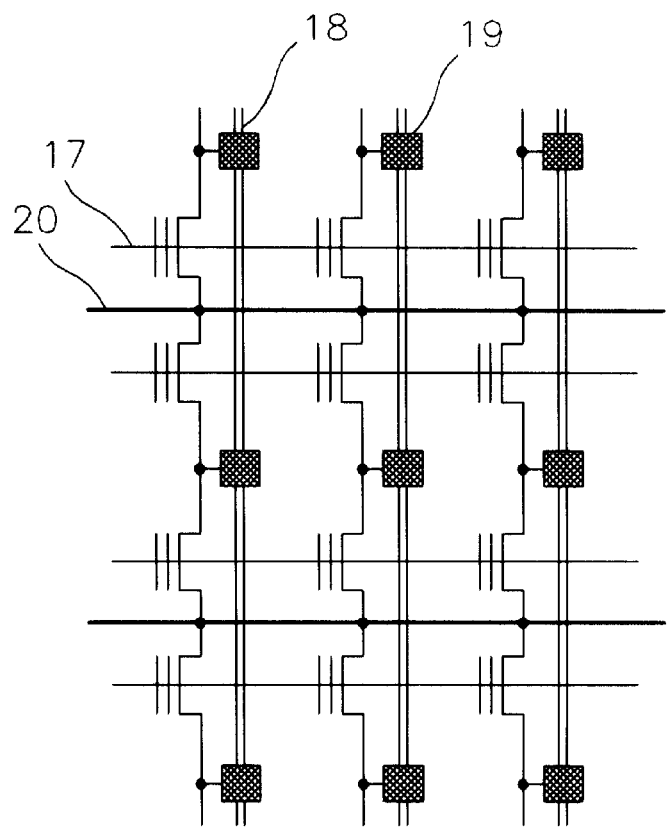
FIG. 2 is an array circuit diagram showing the nonvolatile memory device of FIG. 1.
Figure 3:
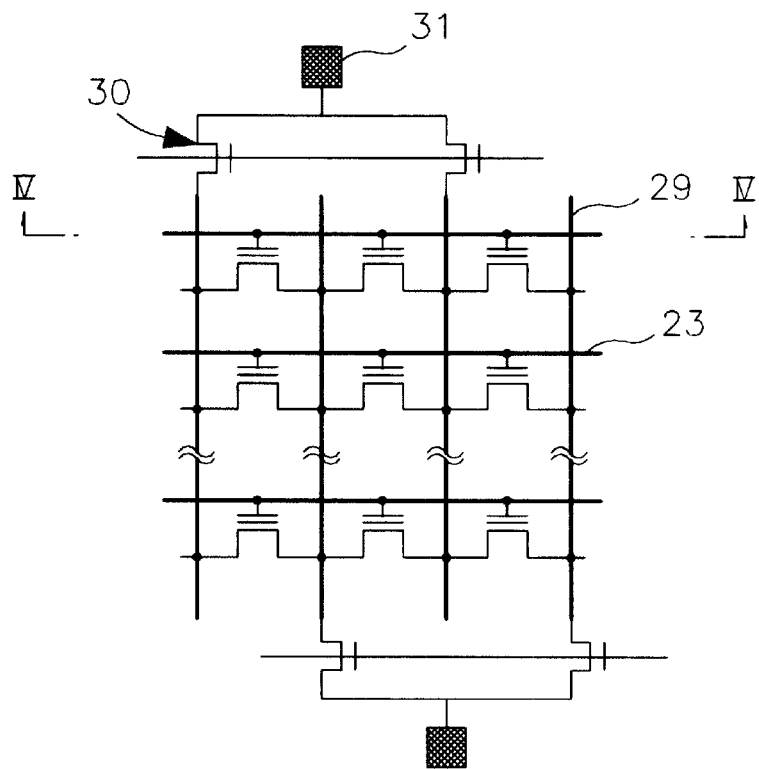
FIG. 3 is an array circuit diagram showing a conventional nonvolatile memory device.
Figure 4:
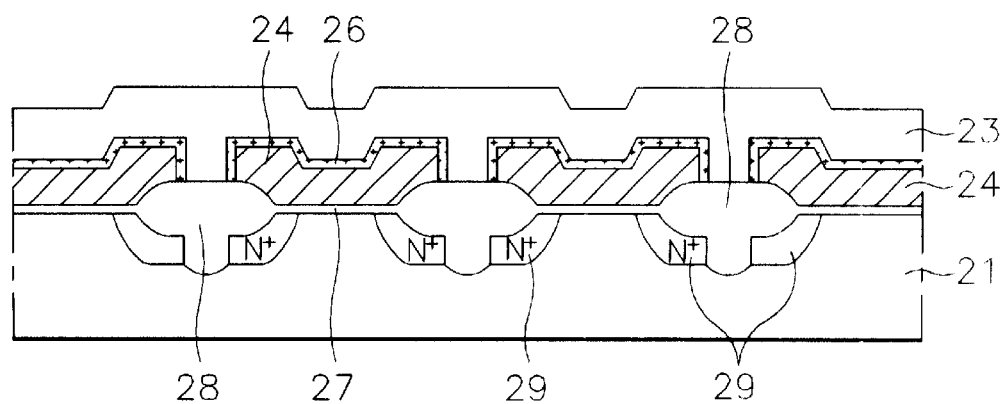
FIG. 4 is a cross-sectional view showing the conventional nonvolatile memory device along line IV—IV of FIG. 3.
Figure 5:
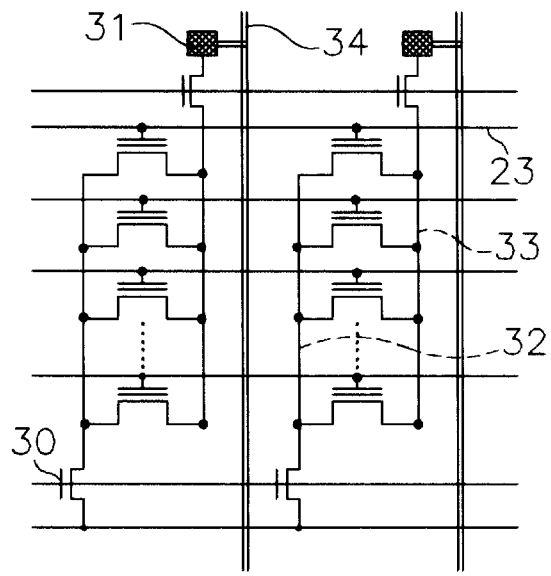
FIG. 5 is an array circuit diagram of a conventional nonvolatile memory device in which source and drain of each cell are divided.
Figure 6:
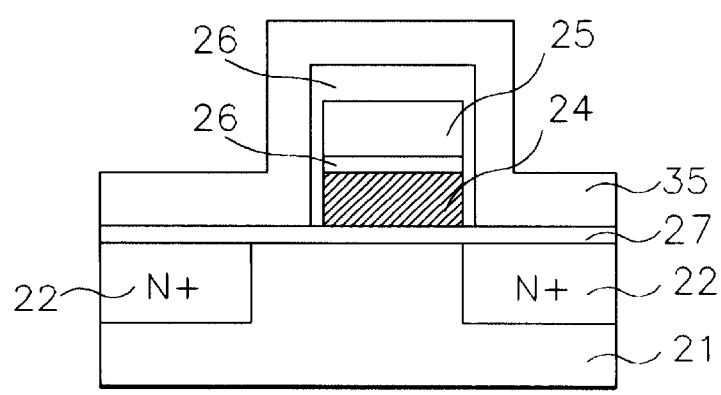
FIG. 6 is a cross-sectional view showing a conventional nonvolatile memory device with channel-dividing cells.

As shown in FIG. 7, a nonvolatile memory cell in accordance with a preferred embodiment according to the present invention includes a control gate 60, a floating gate 53, $n^+$ bitlines 42, and program gates 49. The $n^+$ bitlines 42 preferably function as source and drain. Monitor currents flow between the source and drain, and program currents flow between the floating gates 53 and the program gates 49. During programming, tunneling diodes are formed between the program gates 49 and the floating gates 53 by tunneling to perform programming by providing charges for the floating gates 53.

As shown in FIG. 8, a nonvolatile memory device includes a plurality of word lines 51 formed on a semiconductor substrate (not shown) to be spaced apart from one another by a predetermined distance. A plurality of $n^+$ bitlines 42, spaced apart from one another by a predetermined distance, are preferably formed substantially perpendicular to the plurality of word lines 51 to form square areas. A plurality of program lines 55 are preferably formed on the semiconductor substrate in the same direction as the $n^+$ bitlines 42.

As shown in FIG. 9, to reduce program coupling, the program lines 55 can be formed between pairs of adjacent $n^+$ bitlines 42. To select from a plurality of nonvolatile memory cells 56, positive 8V and negative 8V are applied to a control gate 60 of a word line 51 and a program gate 49 of a program line 55, respectively, to generate tunneling. However, the present invention is not intended to be so limited. For example, 0V and a positive voltage can be applied to the program gate 49 and the control gate 60, respectively, to select cells. In addition, a positive voltage and a negative voltage can be applied to the control gate 60 and the program gate 49, respectively, and bias can be simultaneously applied to the source and drain to turn on the channel in an early programming so that drain currents flow. Then using a sensing amplifier, the drain currents are monitored so that programming is accomplished by tunneling through the program gate 49 and change of charge of the floating gate 48 is monitored at the same time.

Figure 10:
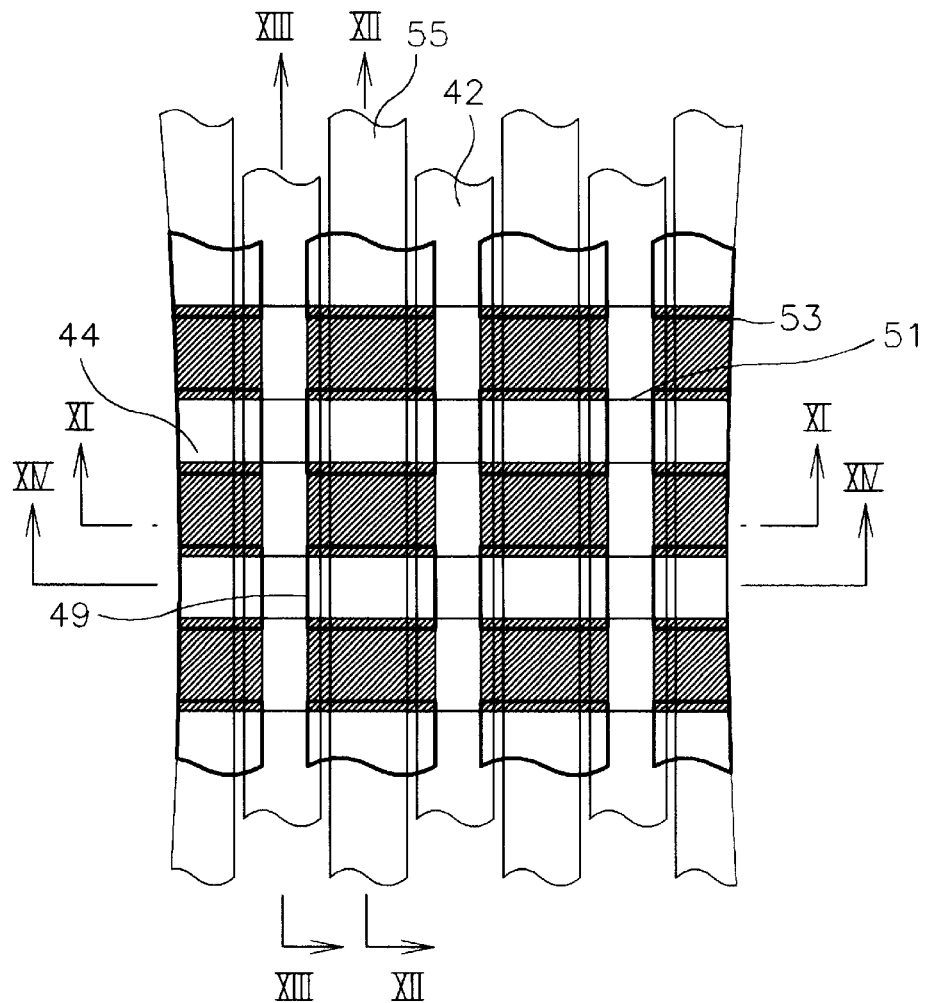
FIG. 10 is a diagram showing a preferred embodiment of a nonvolatile memory device according to the present invention.

As shown in FIG. 10, a first preferred embodiment of a memory cell includes a plurality of $n^+$ bitlines 42 formed in a first direction in a p-type semiconductor substrate (not shown), spaced apart from one another by a predetermined distance. In this case, the n+ bitlines 42 are impurity regions as well as source and drain in a memory cell. A plurality of word lines 51 are formed at substantially right angles to the $n^+$ bitlines 42 being spaced apart from one another by a predetermined distance. Field oxide layers 44 are formed at right angle to the $n^+$ bitlines 42, spaced apart from one another by a predetermined distance. Program lines 55 are formed in substantially the same direction as the $n^+$ bitlines 42 being spaced apart from one another by a predetermined distance.

Floating gates 53 of an island form are formed in a matrix between the $n^+$ bitlines 42 and the field oxide layer 44 on the p-type semiconductor substrate. At this time, each word line 51 is formed to cover a plurality of floating gates 53 formed in the same direction as the word line 51. Each word line 51 is a control gate 60 in a memory cell. The program gates 49 are formed on the field oxide layers 44 in the same direction of the corresponding the program line 55. At this time, each $n^+$ bitline 42, each floating gate 53, each word line 51, and each program line 55 are insulated from one another. The program gates 49 are formed on the field oxide layer 44 between cells. Accordingly, the program gates do not affect a size of a cell. Program tunneling oxide layers 47 are formed between the floating gates 53 to enable programming by tunneling.

Figure 11:
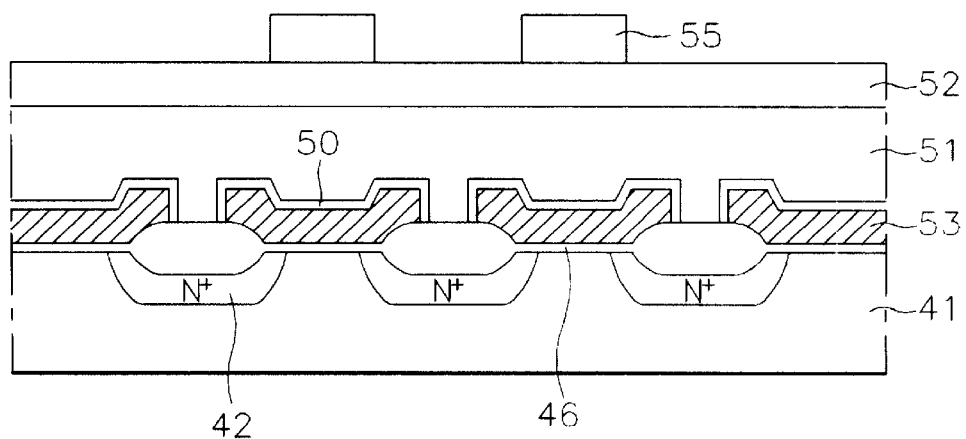
FIG. 11 is a diagram showing a cross-sectional view of the nonvolatile memory device, taken along line XI—XI of FIG. 10.

FIG. 11 is a diagram showing a cross-sectional view of the first preferred embodiment nonvolatile memory device along line XI—XI of FIG. 10. As shown in FIG. 11, the nonvolatile memory device includes the $n^+$ bitlines 42 formed beneath the surface of a p-type semiconductor substrate 41 and spaced apart from one another by a predetermined distance. A gate oxide layer 46 is formed on the semiconductor substrate 41 including the $n^+$ bitlines 42. The plurality of floating gates 53 are formed on the gate oxide layer 46 at both sides of the $n^+$ bitlines 42 and a dielectric film 50 is formed on the surface of the floating gates 53. The word lines 51 are formed on the entire surface including the dielectric film 50. A second oxide layer 52 is formed on the word lines 51, and a plurality of program lines 55 are formed on the second oxide layer 52 over the floating gates 53.

FIG. 12 is a diagram showing a cross-sectional view of the nonvolatile memory device along line XII—XII of FIG. 10. As shown in FIG. 12, the nonvolatile memory device includes a plurality of field oxide layers 44 formed on the p-type semiconductor substrate 41 to be spaced apart from one another by a predetermined distance. The gate oxide layers 46 are formed on the semiconductor substrate at both sides of the field oxide layers 44, and the program gates 49 are formed on the field oxide layers 44. The program tunneling oxide layers 47 are formed on the field oxide layers 44 and on the program gates 49 to have program line contact holes. The floating gates 53 are formed on the gate oxide layers 46 and parts of the program tunneling oxide layers 47. The dielectric layers 50 are formed on the floating gates 53, and the second oxide layers 52 are formed on the program tunneling oxide layer 47 and the word lines 51 to have program line contact holes. The program line 55 is formed on the second oxide layers 52 to be electrically coupled to the program gates 49 through the program line contact holes.

FIG. 13 is a diagram showing a cross-sectional view of the nonvolatile memory device taken along line XIII—XIII of FIG. 10. As shown in FIG. 13, the nonvolatile memory device includes $n^+$ bitlines 42 of ruggedness including the gate oxide layers 46 in the p-type semiconductor substrate 41. The field oxide layers 44 are formed on the semiconductor substrate 41 including the $n^+$ bitlines 42. The word lines 51 are formed on the gate oxide layers 46 and parts of the field oxide layers 44.

Figure 14:
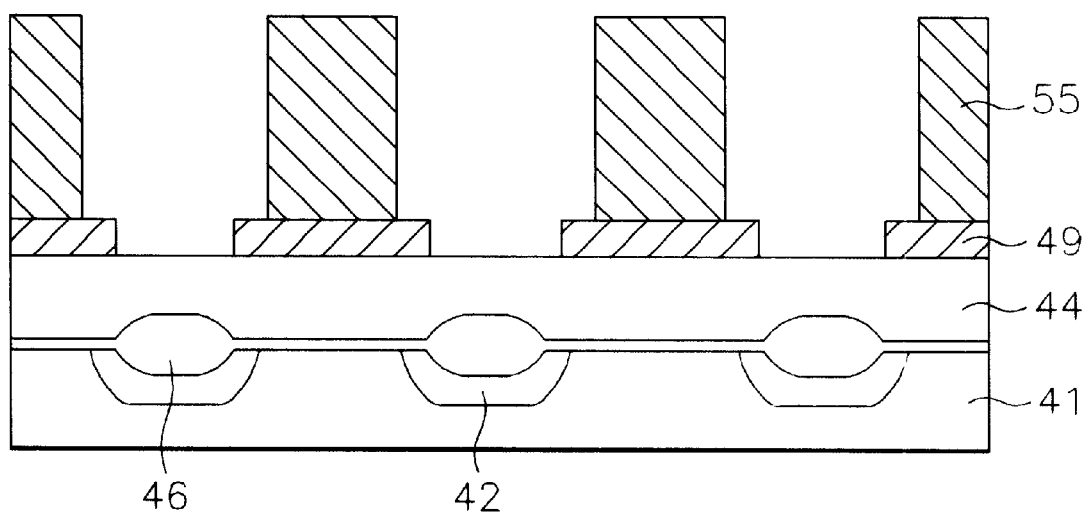
FIG. 14 is a diagram showing a cross-sectional view of the nonvolatile memory, taken along line XIV—XIV of FIG. 10.

FIG. 14 is diagram showing a cross-sectional view of the nonvolatile memory, taken along line XIV—XIV of FIG. 10. As shown in FIG. 14, the nonvolatile memory device includes $n^+$ bitlines 42 and a gate oxide layer 46 formed in a p-type semiconductor substrate 41. The field oxide layer 44 is formed on the semiconductor substrate 41 including the $n^+$ bitlines 42. The program gates 49 are formed on the field oxide layer at both sides of the $n^+$ bitlines 42, and the program lines 55, each of which is formed on the center portion of each program gate 49.

Erasing operations of the first preferred embodiment of the nonvolatile memory device according to the present invention will now be described. An erasing operation is performed through the gate oxide layer 46 of a cell to the semiconductor substrate 41 or to the program gate 49. When the erasing operation is performed to the semiconductor substrate 41, the gate oxide layer 46 should be formed to be an approximate range of 9–11 nm thick, which is suitable for tunneling. As for bias voltages, a negative voltage or a ground voltage is applied to a control gate 60 and a positive voltage to drain.

FIGS. 15A to 15D and FIGS. 16A to 16D are cross-sectional views showing process steps, taken along line XI—XI and line XII—XII of FIG. 10, respectively, of second a preferred embodiment of a method for fabricating the nonvolatile memory device according to the present invention. According to this method, program gates are formed before forming the floating gates. Thus, a buried program gate process is characterized in that the program gates are placed under the floating gates.

Figure 15A:
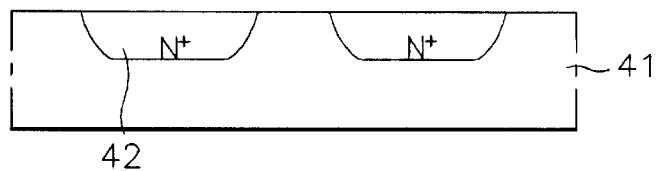
FIGS. 15A to 15D are diagrams showing cross-sectional views of another preferred embodiment of a method for fabricating the nonvolatile memory device, taken along line XI—XI of FIG. 10, according to the present invention.
Figure 16A:
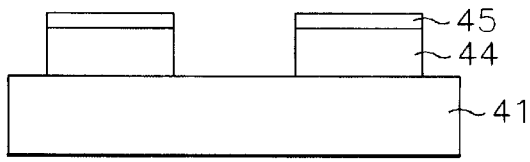
FIGS. 16A to 16D are diagrams showing cross-sectional views of the preferred embodiment of a method for fabricating the nonvolatile memory device, taken along line XII—XII of FIG. 10, according to the present invention.

As shown in FIGS. 15A and 16A, a first photoresist film is deposited on a p-type semiconductor substrate 41 and then is selectively subjected to exposure and development process to be removed for placements of impurity regions. Subsequently, with the first photoresist pattern serving as a mask, n-type heavily doped impurity ions are doped and diffused by drive-in to form $n^+$ bitlines beneath the semiconductor substrate 41. Then, the remaining first photoresist film is removed. To prevent a cell size from increasing because of lateral diffusion of the $n^+$ bitlines 42, placements of $n^+$ bitlines 42 are defined before forming the $n^+$ bitlines 42. Then, high temperature low pressure dielectric (HLD) sidewall spacers are preferably formed on sides of the $n^+$ bitlines 42 before ions are implanted.

Thereafter, a first oxide layer, a first polysilicon layer doped with ions, and a second photoresist film are successively formed by a CVD process. Next, the second photoresist film is selectively subjected to an exposure and development process to remain over placements of field oxide layers. With the second photoresist pattern serving as a mask, the first oxide layer and the first polysilicon layer are selectively etched to form field oxide layers 44 and first polysilicon lines 45. Then, the remaining second photoresist film is removed. At this time, the field oxide layers 44 has a line form, and the areas between the field oxide layers 44 and the $n^+$ bitlines 42 are channel regions.

Figure 15B:
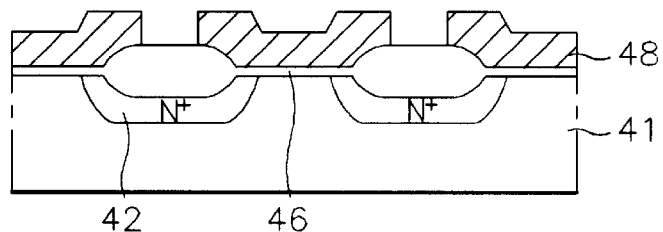
Figure 16B:
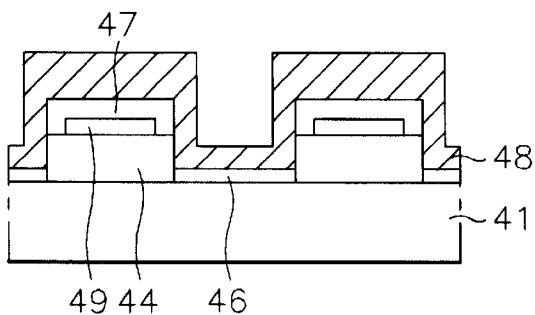

As shown in FIGS. 15B and 16B, a thermal oxidation process is performed over the entire surface including the first polysilicon layers 45 to grow a gate oxide layer 46 and program tunneling oxide layers 47, which uses the thermal oxidation of the surface of the first polysilicon lines 45. In this case, the gate oxide layer 46 is formed to have an approximate thickness of 9–11 nm. Further, the program tunneling oxide layer 47 is formed thicker than the gate oxide layer 46 because of a high concentration of impurity ions in the first polysilicon lines 45 and the traits of the first polysilicon lines 45 itself. Since the concentration of impurity ions of the $n^+$ bitlines 42 is high, the gate oxide layer 46 on the $n^+$ bitlines 42 is thick, for example, in an approximate range of 70–300 Angstroms. Therefore, enough etch barrier can be obtained for etching the polysilicon layer in the following process.

Next, a second polysilicon layer and a third photoresist film are successively formed on the entire surface including the gate oxide layer 46 and the program tunneling oxide layer 47. Then, the third photoresist film is selectively subjected to an exposure and development process to be removed over the $n^+$ bitlines 42. With the third photoresist pattern as a mask, the second polysilicon layer is selectively etched to form second polysilicon lines 48. Next, the program tunneling oxide layer 47 and the first polysilicon lines 45 are selectively etched to form the plurality of program gates 49 of a rectangular matrix form. Then, the remaining third photoresist film is removed. In this case, in forming the program gates 49, the field oxide layers 44 are also selectively etched to have a matrix form, not a line form. In addition, the second polysilicon lines 48 cover the channel regions.

Figure 15C:
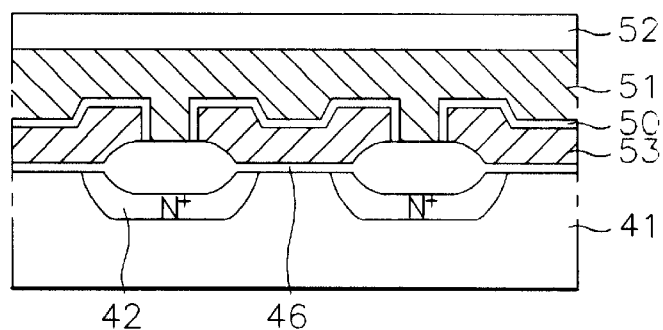
Figure 16C:
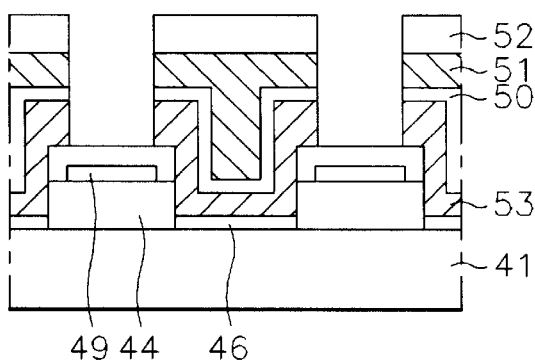

As shown in FIGS. 15C and 16C, a dielectric film 50 is formed on the second polysilicon lines 48, and then a third polysilicon layer, a second oxide layer 52, and a fourth photoresist film are successively formed on the entire surface including the dielectric film 50. In this case, the dielectric film 50 is preferably formed using an oxide or oxide nitride oxide (ONO) to remove leakage current generated in operation.

The fourth photoresist film is subjected to an exposure and development process to be removed over the field oxide layers 44. With the fourth photoresist pattern serving as a mask, the second oxide layer 52, the third polysilicon layer, the dielectric film 50, and the second polysilicon lines 48 are selectively etched. The remaining fourth photoresist film is removed. At this time, the third polysilicon layer is selectively etched to form, at right angle to the $n^+$ bitlines 42, the word lines 51 between the field oxide layers 44, and the second polysilicon layer 48 is selectively etched to form a plurality of floating gates 53 on the gate oxide layers 46 between the $n^+$ bitlines 42 and the field oxide layers 44. In this case, after growing the program tunneling oxide layer 47 by oxidizing the first polysilicon layer, i.e. the program gates 49, the floating gates 53 are formed. Thus, the floating gates 53 contacts the tunneling oxide layer 47 on the program gates 49 and overlap corner portions of the adjacent program gates 49 to increase a coupling ratio and increasing tunneling efficiency. In addition, since the surface of the program gates 49 are rugged, the tunneling efficiency increases. That is, the surface of the program gate 49 has ruggedness because of the grain structure of the polysilicon. If the polysilicon is oxide, the interface between the polysilicon and the oxide layer is rugged, and the ruggedness of the surface of the oxide layer becomes smoothed. For this reason, on rugged portions, electric field is intensified. When electrodes are formed on such polysilicon, characteristics of tunneling current are enhanced.

Figure 15D:
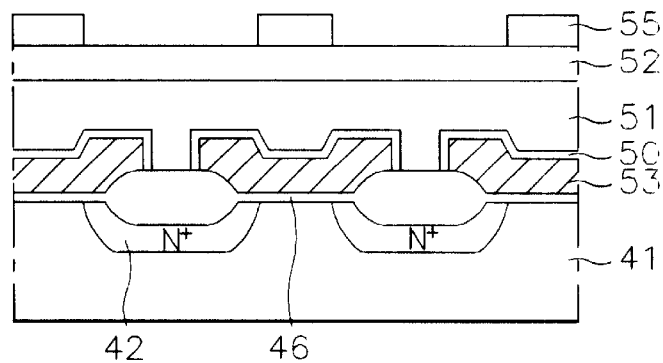
Figure 16D:
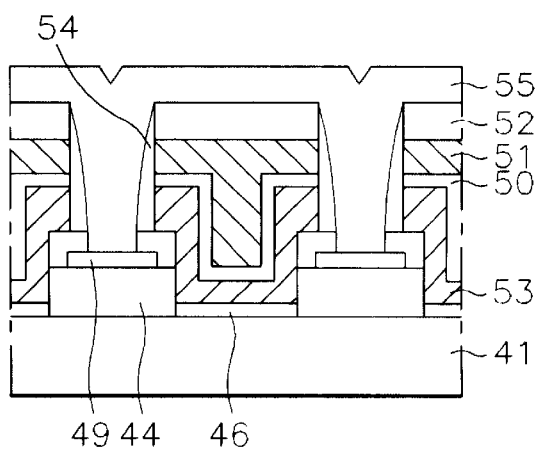

Referring to FIGS. 15D and 16D, a third oxide layer is formed on the entire surface including the second oxide layer 52 and then is selectively patterned with an etch-back process to form third oxide sidewall spacers 54 on both sides of the second oxide layer 52, the word lines 51, the dielectric layer 50, and the floating gates 53. With the second oxide layer 52 and the third oxide sidewall spacers 54 serving as masks and the program gate 49 serving as an etch stopper, the program tunneling oxide layer 47 is selectively etched to expose a portion of the program gates 49. The program lines 55 are formed on the entire surface including the second oxide layer 52 and the third oxide sidewall spacers 54. At this time, each program line 55 is formed between a pair of adjacent $n^+$ bitlines 42.

As described above, the preferred embodiments of a nonvolatile memory device and method according to the present invention have various advantages. A nonvolatile memory cell having a simple stacked structure is selected by applying predetermined voltages to a program gate and a control gate to be programmed or erased. Thus, no metal contact holes are needed. Therefore, a smaller or minimum effective cell size is provided and program disturb is restrained. In addition, since the program gate is placed under the floating gate, the characteristic of program tunneling to the floating gate through the program gate reduces an operation voltage.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a memory device comprising the steps of:

forming first signal lines of second conductivity type along a first direction separated by a first prescribed distance in a substrate of a first conductivity type;

forming second signal lines on the substrate along a second direction separated from one another by a second prescribed distance, wherein the second direction is substantially perpendicular to the first direction, and wherein the second signal lines include first conductive lines on an isolating layer;

forming a first insulating layer on the substrate and a second insulating layer on both sides and a top surface of the second signal lines;

forming a second conductive layer and selectively removing the second conductive layer, the second insulating layer, and the first conductive lines to form third signal lines along the first direction and first gates;

forming a dielectric film on the third signal lines;

forming a third conductive layer and a third insulating layer and selectively removing the third insulating layer, the third conductive layer, the dielectric film, and the third signal lines to form fourth signal lines and second gates between the first conductive lines, wherein the fourth signal lines extend along the second direction;

forming insulating sidewall spacers on both sides of the patterned third insulating layer, the fourth signal lines, the dielectric film, and the second gates;

forming contact holes in the second insulating layer; and forming fifth signal lines coupled to the first gates through the contact holes.

2. The method as claimed in claim 1, wherein the first gates are program gates and the second gates are floating gates, wherein the first signal lines are bitlines, the fourth signal lines are word lines, and the fifth signal lines are program lines, and wherein the first insulation layer is a gate insulation layer, the second insulation layer is a tunneling insulation layer.

3. The method of claim 1, wherein the second gates overlap a side surface and a top surface forming a corner of the second insulating layer.

4. The method of claim 3, wherein the second insulating layer overlaps a corner defined by the top surface of the second signal lines.

5. A method for fabricating a nonvolatile memory device comprising the steps of:

forming bitlines of second conductivity type along a first direction separated by a first prescribed distance in a substrate of a first conductivity type;

forming first conductive lines on the substrate along a second direction separated from one another by a second prescribed distance, wherein the second direction is substantially perpendicular to the first direction, and wherein the first conductive lines include a first conductive layer on an isolating layer;

forming a gate insulating layer on the substrate and a tunneling insulating layer on the first conductive lines;

forming a second conductive layer on the entire surface, and selectively removing the second conductive layer, and the first conductive lines to form second conductive lines along the first direction and program gates;

forming a dielectric film on the second conductive lines;

forming a third conductive layer and an insulating layer on the entire surface, and selectively removing the insulating layer, the third conductive layer, the dielectric film, and the second conductive lines to form word lines and floating gates between the first conductive lines, wherein the floating gates overlap two sides forming a corner of the tunneling insulating layer, wherein the word lines extend along the second direction;

forming insulating sidewall spacers on both sides of the patterned insulating layer, the word lines, the patterned dielectric film, and the floating gates;

forming contact holes in the tunneling insulating layer; and forming program lines coupled to the program gates through the contact holes.

6. The method as claimed in claim 5, wherein each of the program lines is formed between a pair of the adjacent bitlines on the insulating layer between the bitlines.

7. The method as claimed in claim 5, wherein the gate insulating layer and the tunneling insulating layer are concurrently formed by subjecting a thermal oxidation process to the exposed substrate and the first conductive lines, respectively.

8. The method as claimed in claim 5, wherein the gate insulating layer is 9–11 nm thick.

9. The method as claimed in claim 5, wherein the isolating layer is formed with a chemical vapor deposition (CVD) process.

10. The method as claimed in claim 5, wherein the floating gate is formed to overlap a corner portion of the adjacent program gate.

11. The method as claimed in claim 5, wherein the program gates are formed to have a substantially rectangular form.

12. The method as claimed in claim 5, wherein the dielectric film is made of oxide nitride oxide (ONO).

13. The method of claim 5, wherein a side of the tunneling insulating layer opposite the contact holes forms the corner with a top surface of the tunneling insulating layer.

14. The method of claim 13, wherein the forming a gate insulating layer and a tunneling insulating layer forms the tunneling insulating layer on both sides and a top surface of the first conductive lines.

15. A method for fabricating a nonvolatile memory device comprising the steps of:

forming bitlines of second conductivity type in a first direction separated from one another by a first prescribed distance beneath a surface of a substrate of a first conductivity type;

successively forming an isolating layer and a first conductive layer and then selectively removing the isolating layer and the first conductive layer to form first conductive lines in a second direction separated from one another, wherein the second direction is substantially perpendicular to the first direction;

forming a gate insulating layer on the substrate and a tunneling insulating layer on both sides and a top surface to overlap first and second corners of each of the first conductive lines;

forming a second conductive layer on the entire surface, and selectively removing the second conductive layer, the tunneling insulating layer, the first conductive lines, and the isolating layer to form second conductive lines between the bitlines;

forming a dielectric layer on the second conductive lines;

successively forming a third conductive layer and an insulating layer on the entire surface and selectively removing the insulating layer, the third conductive layer, the dielectric layer, and the second conductive lines to form word lines and floating gates between the first conductive lines;

forming insulating sidewall spacers on both sides of the patterned insulating layer, the word lines, the dielectric layer, and the floating gates;

selectively patterning the tunneling insulating layer using the insulating sidewall spacers as a mask to form contact holes; and forming program lines coupled to program gates through the contact holes on the insulating layer between the bitlines.

16. The method as claimed in claim 15, wherein each of the program lines is formed between a pair of the adjacent bitlines on the insulating layer between the bitlines.

17. The method as claimed in claim 15, wherein the bitlines are formed by implanting n-type impurity ions into the substrate of first conductive type.

18. The method as claimed in claim 15, wherein the gate insulating layer and the tunneling insulating layer are concurrently formed by subjecting a thermal oxidation process to the exposed substrate and the first conductive lines, respectively.

19. The method as claimed in claim 15, wherein the gate insulating layer is approximately in a range of 9–11 nm thick.

20. The method as claimed in claim 15, wherein the forming bitlines step comprises:

forming sidewall spacers to define bitline placements;

implanting impurity ions to form the bitlines; and removing the sidewall spacers.

21. The method as claimed in claim 15, wherein the isolating layer is formed with a chemical vapor deposition (CVD) process.

22. The method as claimed in claim 15, wherein the floating gate is formed to overlap a corner portion of the adjacent program gate.

23. The method as claimed in claim 15, wherein the forming a second conductive layer step further forms the program gates and isolation layers between the bitlines.

24. The method of claim 15, wherein the floating gates overlap a corner of the tunneling insulating layer, formed by a top surface of the tunneling insulating layer and a side surface of the tunneling insulating layer opposite the contact holes.

* * * * *